United States Patent
Hashimoto et al.

(10) Patent No.: US 10,185,220 B2
(45) Date of Patent: Jan. 22, 2019

(54) SUBSTRATE PROCESSING METHOD, SUBSTRATE PROCESSING APPARATUS, AND NON-TRANSITORY COMPUTER-READABLE MEDIUM

(71) Applicant: Tokyo Electron Limited, Tokyo (JP)

(72) Inventors: Yusaku Hashimoto, Koshi (JP); Takeshi Shimoaoki, Koshi (JP); Masahiro Fukuda, Koshi (JP); Kouichirou Tanaka, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 14 days.

(21) Appl. No.: 15/262,489

(22) Filed: Sep. 12, 2016

(65) Prior Publication Data

US 2017/0102616 A1    Apr. 13, 2017

(30) Foreign Application Priority Data

Oct. 9, 2015   (JP) ................. 2015-201200

(51) Int. Cl.
| | |
|---|---|
| B05C 11/08 | (2006.01) |
| B05C 5/02 | (2006.01) |
| B05D 1/40 | (2006.01) |
| B05D 1/26 | (2006.01) |
| G03F 7/30 | (2006.01) |
| B05D 1/00 | (2006.01) |
| H01L 21/67 | (2006.01) |

(52) U.S. Cl.
CPC .............. *G03F 7/3021* (2013.01); *B05C 5/02* (2013.01); *B05C 11/08* (2013.01); *B05D 1/005* (2013.01); *H01L 21/6715* (2013.01)

(58) Field of Classification Search
CPC ......... B05C 11/08; B05C 5/02; G03F 7/3021; H01L 21/6715; B05D 1/005; B05D 1/26
USPC ............................................ 118/702; 355/27
See application file for complete search history.

(56) References Cited

U.S. PATENT DOCUMENTS

| | | | | |
|---|---|---|---|---|
| 2007/0264007 A1* | 11/2007 | Kitahara | ............... | G03F 7/3021 396/518 |
| 2015/0036109 A1* | 2/2015 | Yoshihara | ................. | G03F 7/30 355/27 |

FOREIGN PATENT DOCUMENTS

JP    2015-053467 A1    3/2015

* cited by examiner

*Primary Examiner* — Alexander M Weddle
(74) *Attorney, Agent, or Firm* — Burr & Brown, PLLC

(57) ABSTRACT

A substrate processing method includes steps of: supplying a developer onto a substrate surface from a discharge port while the substrate is rotated at a first rotation speed and a liquid contact surface faces the surface, and moving the nozzle while the liquid contact surface contacts with the developer so that a liquid film of the developer is formed on the surface; rotating the substrate at a second rotation speed slower than the first rotation speed, after the liquid film is formed, in a state where supply of the developer is stopped; rotating the substrate at a third rotation speed faster than the first rotation speed, after the substrate is rotated at the second rotation speed; and reducing rotation speed of the substrate to the second rotation speed or less, after the substrate is rotated at the third rotation speed, so that the liquid film is held on the surface.

13 Claims, 11 Drawing Sheets

SUBSTRATE PROCESSING METHOD, SUBSTRATE PROCESSING APPARATUS, AND NON-TRANSITORY COMPUTER-READABLE MEDIUM

CROSS REFERENCE TO RELATED APPLICATION

This application is based upon and claims the benefit of priority from the prior Japanese Patent Application No. 2015-201200 filed on Oct. 9, 2015, the entire contents of which are incorporated herein by reference.

BACKGROUND OF THE INVENTION

Field of the Invention

The present invention relates to a substrate processing method, a substrate processing apparatus, and a non-transitory computer-readable medium.

Description of the Related Art

Japanese patent application publication No. 2015-53467 discloses a development method using a nozzle including a discharge port for developer and a liquid contact surface formed around the discharge port.

This development method includes a step of forming a developer liquid film on a substrate by supplying the developer from the discharge port to a surface of the substrate in a state in which the nozzle is arranged in such a manner that the liquid contact surface faces the surface of the substrate by rotating the substrate, and moving the nozzle while the liquid contact surface is in contact with the developer.

SUMMARY OF THE INVENTION

An object of the present invention is to provide a method, an apparatus and a non-transitory computer-readable medium which can further certainly suppress a development progress amount from being varied according to a position on a substrate.

One aspect of the present invention is directed to a substrate processing method comprising the steps of: supplying a developer onto a surface of a substrate from a discharge port of a nozzle in a state in which the substrate is rotated at a first rotation speed and a liquid contact surface formed around the discharge port faces the surface of the substrate, and moving the nozzle while the liquid contact surface is in contact with the developer in such a manner that a liquid film of the developer is formed on the surface of the substrate; rotating the substrate at a second rotation speed which is slower than the first rotation speed after the liquid film is formed on the surface of the substrate, in a state in which supply of the developer from the discharge port is stopped; rotating the substrate at a third rotation speed which is faster than the first rotation speed, after the substrate is rotated at the second rotation speed;

and reducing rotation speed of the substrate to the second rotation speed or less, after the substrate is rotated at the third rotation speed, in such a manner that the liquid film is held on the surface of the substrate.

According to this aspect of the substrate processing method, in the process to form a liquid film, the liquid contact surface of the nozzle is in contact with the developer supplied from the discharge port of the nozzle to a surface of the substrate. By a relative motion between the liquid contact surface and the surface of the substrate, the developer is stirred therebetween. Therefore, uniformity of the development progress speed between the liquid contact surface and the surface of the substrate is increased.

After the liquid film is formed, the rotation speed of the substrate is reduced from the first rotation speed to the second rotation speed, and then increased to the third rotation speed which is faster than the first rotation speed. By reducing the rotation speed of the substrate from the first rotation speed to the second rotation speed, the developer approaches the rotation center side of the substrate, and by increasing the rotation speed of the substrate from the second rotation speed to the third rotation speed, the developer spreads on the outer peripheral side of the substrate. Since the developer approaches the rotation center side of the substrate before the developer spreads on the outer peripheral side of the substrate, a kinetic energy of the developer is increased when the developer spreads on the outer peripheral side of the substrate. Therefore, the developer on the rotation center side of the substrate further certainly spreads over the outer peripheral side of the substrate. As a result, uniformity of the film thickness of the liquid film and uniformity of the concentration of the developer in the liquid film are increased. Therefore, also after the liquid film is formed, the uniformity of the development progress speed is increased.

As described above, the uniformity of the development progress speed is increased both in the liquid film formation process and after formation of the liquid film, and therefore the development progress amount can be further certainly suppressed from varying according to a position on the substrate.

When the liquid film is formed on the surface of the substrate by moving the nozzle while the liquid contact surface is in contact with the developer, the nozzle may be moved from an outer peripheral side of the substrate to a rotation center side of the substrate. According to this case, the developer is supplied on the rotation center side of the substrate after the developer is supplied on the outer peripheral side of the substrate. Therefore, immediately after the liquid film is formed, freshness of the developer is increased as the developer approaches the rotation center side of the substrate. Therefore, when the substrate is rotated at the third rotation speed, the developer, which is not very fresh, on the outer peripheral side is replaced with the developer, which is very fresh, on the rotation center side. In response to the freshness of the developer being increased, uniformity of the concentration of the developer has a tendency to increase. Therefore, by replacing the developer with low freshness with the developer with high freshness, the uniformity of the concentration of the developer in the liquid film is further increased. As a result, the uniformity of the development progress speed can be further increased.

The substrate processing may further comprise the step of, after the liquid film is formed on the surface of the substrate, distancing the liquid contact surface from the surface of the substrate before rotation of the substrate at the second rotation speed is completed. According to this case, by expanding a space between the liquid contact surface and the surface of the substrate before the rotation of the substrate at the second rotation speed is completed, the developer in the liquid film can further certainly come close to the rotation center side of the substrate. Therefore, when the substrate is rotated at the third rotation speed, uniformity of the film thickness of the liquid film and the concentration of the developer in the liquid film can be further increased.

The step of distancing the liquid contact surface from the surface of the substrate may include the steps of: distancing the liquid contact surface from the surface of the substrate by a first distance at a first speed; and further distancing the liquid contact surface at a second speed which is slower than the first speed, after holding a state in which the liquid contact surface is separated from the surface of the substrate by the first distance. According to this case, the contact surface between the liquid contact surface and the liquid film is reduced by holding the distance between the liquid contact surface and the surface of the liquid film after the liquid contact surface is separated from the surface of the substrate by the first distance at the first speed. After that, by further distancing the liquid contact surface at the second speed which is slower than the first speed, tear-off of the developer is suppressed when the liquid contact surface is distanced from the liquid film. Thus, when the liquid contact surface is distanced from the liquid film, the developer does not easily remain on the liquid contact surface, and therefore occurrence of dripping of the developer from the liquid contact surface distanced from the liquid film is suppressed. Therefore, when the substrate is rotated at the third rotation speed, uniformity of the film thickness of the liquid film and the concentration of the developer in the liquid film can be further increased.

The first distance may be a distance such that a liquid column is formed between the liquid film of the developer and the liquid contact surface. According to this case, in a state in which tear-off of the developer is prevented in a process to separate the liquid contact surface from a surface of the substrate by the first distance, the contact surface between the liquid contact surface and the liquid film is further certainly reduced. Therefore, when the liquid contact surface is distanced from the liquid film, the developer can be further certainly prevented from remaining on the liquid contact surface.

When the liquid film is formed on the surface of the substrate by moving the nozzle while the liquid contact surface is in contact with the developer, a moving speed of the nozzle may be changed in middle. According to this case, by changing the moving speed of the nozzle, the amount of the developer on the rotation center side of the liquid film can be more certainly optimized. Therefore, when the substrate is rotated at the third rotation speed, uniformity of the film thickness of the liquid film and the concentration of the developer in the liquid film can be further certainly increased. "The amount of the developer" in the liquid film means a developer amount per unit area of the liquid film. The same is true for the below.

When the liquid film is formed on the surface of the substrate by moving the nozzle while the liquid contact surface is in contact with the developer, the moving speed of the nozzle may be reduced as the discharge port approaches a rotation center of the substrate. According to this case, immediately after the liquid film is formed, the amount of the developer on the rotation center side of the liquid film is increased in comparison with the amount on the outer peripheral side of the liquid film. Therefore, when the substrate is rotated at the third rotation speed, the developer on the rotation center side of the substrate further certainly spreads over the outer peripheral side of the substrate, and therefore uniformity of the film thickness of the liquid film and the concentration of the developer in the liquid film can be further certainly increased.

When the liquid film is formed on the surface of the substrate by moving the nozzle while the liquid contact surface is in contact with the developer, a discharge amount of the developer from the discharge port may be changed in middle. According to this case, by changing the discharge amount of the developer from the discharge port, the amount of the developer on the rotation center side of the liquid film can be more certainly optimized. Therefore, when the substrate is rotated at the third rotation speed, uniformity of the film thickness of the liquid film and the concentration of the developer in the liquid film can be further certainly increased.

When the liquid film is formed on the surface of the substrate by moving the nozzle while the liquid contact surface is in contact with the developer, the discharge amount of the developer from the discharge port may be increased as the discharge port approaches a rotation center of the substrate. According to this case, immediately after the liquid film is formed, the amount of the developer on the rotation center side of the liquid film is increased in comparison with the amount on the outer peripheral side of the liquid film. Therefore, when the substrate is rotated at the third rotation speed, the developer on the rotation center side of the substrate further certainly spreads over the outer peripheral side of the substrate, and thus uniformity of the film thickness of the liquid film and the concentration of the developer in the liquid film can be further certainly increased.

When the liquid film is formed on the surface of the substrate by moving the nozzle while the liquid contact surface is in contact with the developer, the nozzle may be moved under condition that a position where the discharge port deviates from a rotation center of the substrate is treated as an end point. According to this case, in accordance with a position where movement of the nozzle is stopped, the amount of the developer on the rotation center side of the liquid film can be adjusted. For example, by stopping the movement of the nozzle before the discharge port arrives at the rotation center of the substrate, the amount of the developer may be reduced on the rotation center side of the liquid film. On the other hand, by moving the nozzle until the discharge port passes through the rotation center of the substrate, the amount of the developer can be increased on the rotation center side of the liquid film. Therefore, in accordance with a position where the movement of the nozzle is stopped, the amount of the developer on the rotation center side of the liquid film can be further certainly optimized. Therefore, when the substrate is rotated at the third rotation speed, uniformity of the film thickness of the liquid film and the concentration of the developer in the liquid film can be further certainly increased.

When the liquid film is formed on the surface of the substrate by moving the nozzle while the liquid contact surface is in contact with the developer, the nozzle may be moved under condition that a position where the discharge port deviates from the rotation center of the substrate and the rotation center of the substrate passes on the liquid contact surface is treated as the end point. According to this case, even in a case where movement of the nozzle is stopped at a position where the discharge port deviates from the rotation center of the substrate, the range facing the liquid contact surface of the nozzle covers all over the surface of the substrate. Therefore, the developer can be further certainly applied to the rotation center. Therefore, when the substrate is rotated at the third rotation speed, uniformity of the film thickness of the liquid film and the concentration of the developer in the liquid film can be further certainly increased.

When the liquid film is formed on the surface of the substrate by moving the nozzle while the liquid contact surface is in contact with the developer, the nozzle may be moved until the discharge port passes through the rotation center of the substrate. According to this case, immediately after the liquid film is formed, the amount of the developer on the rotation center side of the liquid film is increased in comparison with the amount on the outer peripheral side of the liquid film. Therefore, when the substrate is rotated at the third rotation speed, the developer on the rotation center side of the substrate further certainly spreads over the outer peripheral side of the substrate, and therefore uniformity of the film thickness of the liquid film and the concentration of the developer in the liquid film can be further certainly increased.

Another aspect of the present invention is directed to a substrate processing apparatus comprising: a rotation holding unit configured to hold and rotate a substrate; a developer supply unit which has a nozzle including a discharge port for a developer and a liquid contact surface formed around the discharge port, and a nozzle conveying mechanism for conveying the nozzle, and supplies the developer onto a surface of the substrate; and a controller, wherein the controller is configured to perform: controlling the rotation holding unit in such a manner that the substrate is rotated at a first rotation speed, and controlling the developer supply unit in such a manner that the developer is supplied onto the surface of the substrate from the discharge port in a state in which the liquid contact surface faces the surface of the substrate, and the nozzle is moved while the liquid contact surface is in contact with the developer to form a liquid film of the developer on the surface of the substrate, controlling, after the liquid film is formed on the surface of the substrate, the rotation holding unit in such a manner that the substrate is rotated at a second rotation speed which is slower than the first rotation speed in a state in which supply of the developer from the discharge port is stopped, controlling, after the substrate is rotated at the second rotation speed, the rotation holding unit in such a manner that the substrate is rotated at a third rotation speed which is faster than the first rotation speed, and controlling, after the substrate is rotated at the third rotation speed, the rotation holding unit in such a manner that the substrate is rotated at the second rotation speed or less so as to hold the liquid film on the surface of the substrate.

Another aspect of the present invention is directed to a non-transitory computer-readable medium storing a program causing a substrate processing apparatus to execute any of the above-described substrate processing methods.

According to the present invention, a development progress amount can be further certainly suppressed from varying according to a position on a substrate.

DETAILED DESCRIPTION OF THE INVENTION

Figure 1:
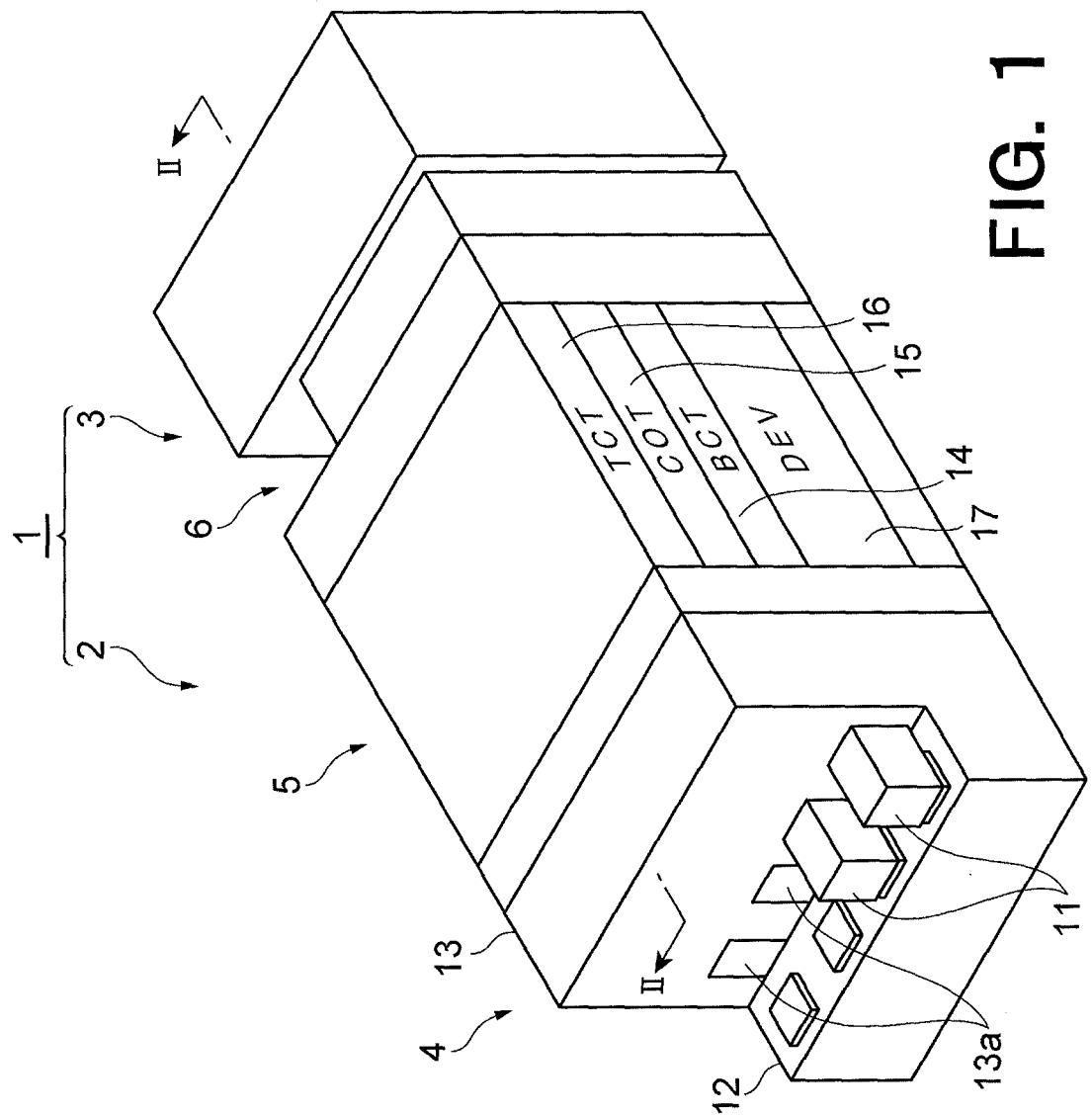
FIG. 1 is a perspective view illustrating a schematic configuration of a substrate processing system.

An Embodiment will be described below with reference to the drawings. In the description, the same elements and elements having the same functions are denoted by the same reference numerals, and redundant descriptions will be omitted.

Substrate Processing System

A substrate processing system 1 is a system which forms a photosensitive coating film, exposes the photosensitive coating film, and develops the photosensitive coating film on a substrate. A substrate to be processed is, for example, a wafer W of a semiconductor. The photosensitive coating film is, for example, a resist film. The substrate processing system 1 includes an application/development device 2 and an exposure device 3. The exposure device 3 performs an exposure process on a resist film (photosensitive coating film) formed on the wafer W (substrate). Specifically, by a method such as a liquid immersion exposure, a portion of the resist film to be exposed is irradiated with an energy line. The application/development device 2 performs a process to form a resist film on a surface of the wafer W (substrate) before the exposure process by the exposure device 3, and performs a development process on the resist film after the exposure process.

Substrate Processing Apparatus

Figure 2:
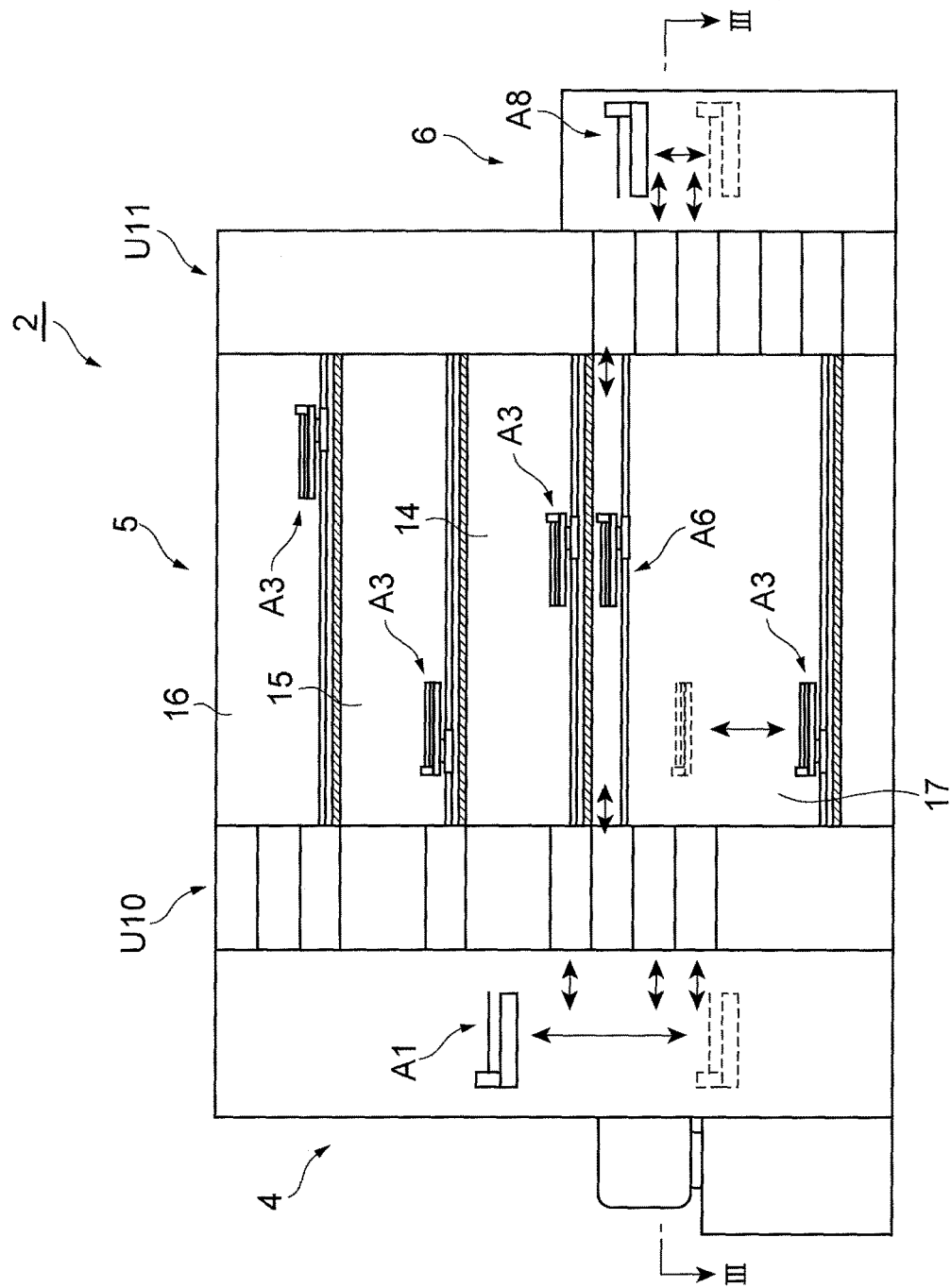
FIG. 2 is a sectional view along line II-II in FIG. 1.
Figure 3:
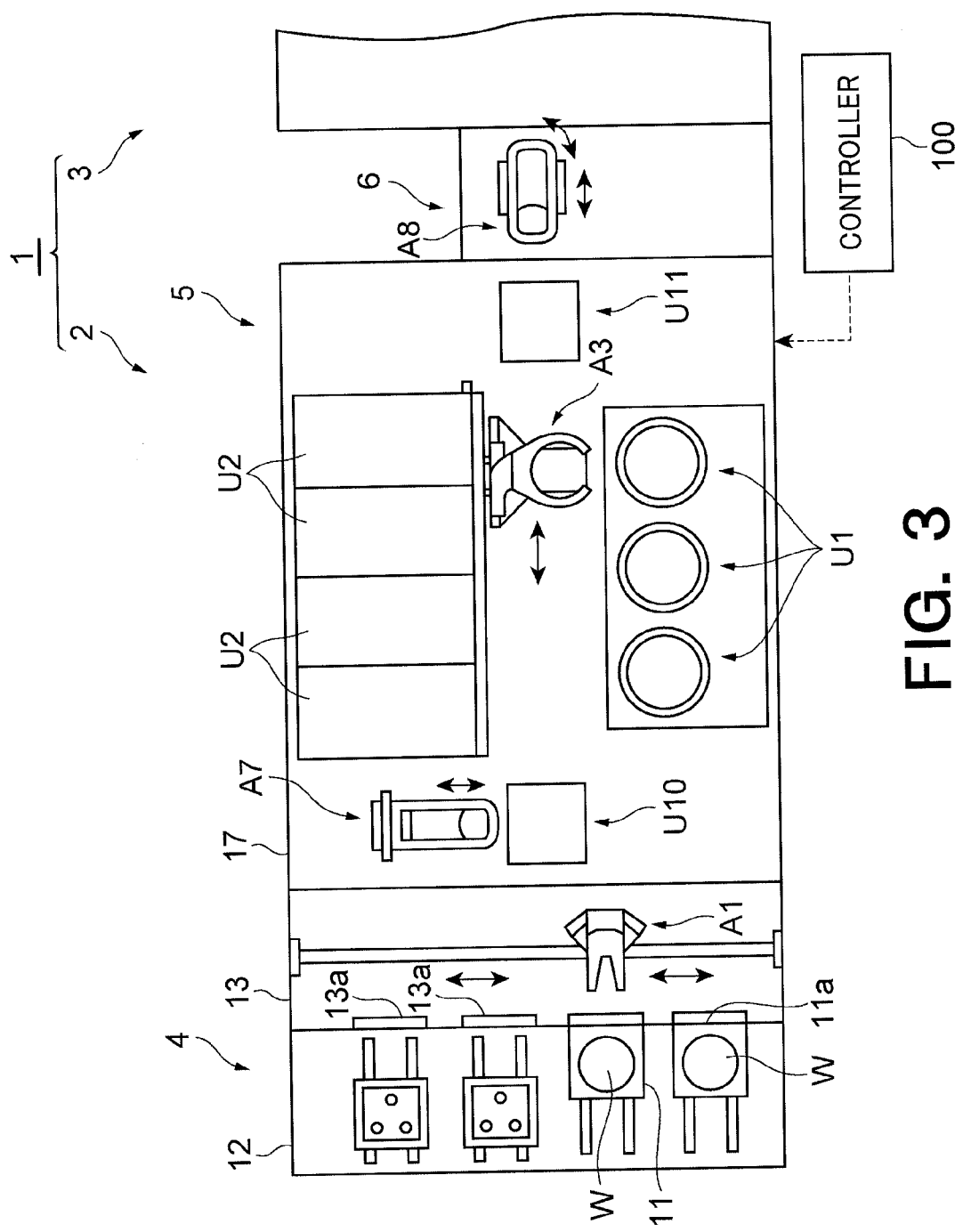
FIG. 3 is a sectional view along line in FIG. 2.

As an example of the substrate processing apparatus, a configuration of the application/development device 2 will be described below. As illustrated in FIGS. 1 to 3, the application/development device 2 includes a carrier block 4, a processing block 5, an interface block 6, and a controller 100.

The carrier block 4 introduces the wafer W into the application/development device 2 and guides the wafer W out of the inside of the application/development device 2. For example, the carrier block 4 can support a plurality of carriers 11 for wafers W, and has a delivery arm A1 built-in. The carriers 11 store, for example, a plurality of round wafers W. The delivery arm A1 takes out a wafer W from the carrier 11 and then delivers the wafer W to the processing block 5, and receives a wafer W from the processing block 5 and then returns the wafer W in the carrier 11.

The processing block 5 includes a plurality of processing modules 14, 15, 16, 17. As illustrated in FIGS. 2 and 3, the processing modules 14, 15, 16, and 17 incorporate a plurality of liquid processing units U1, a plurality of heat processing units U2, and a conveying arm A3 which conveys a wafer W to these units. The processing module 17 further incorporates a direct conveying arm A6 which directly conveys a wafer W without being conveyed to the liquid processing units U1 and the heat processing units U2. The liquid processing units U1 each apply a process liquid onto a surface of a wafer W. The heat processing units U2 each incorporate, for example, a heating plate and a cooling plate, and the heat processing units U2 perform a heat processing by heating the wafer W by using the heating plate and by cooling the heated wafer W by using the cooling plate.

The processing module 14 forms a lower layer film on a surface of the wafer W by using the liquid processing units U1 and the heat processing units U2. The liquid processing units U1 of the processing module 14 apply a process liquid for the lower layer film onto the wafer W. The heat processing units U2 of the processing module 14 perform various kinds of heat processing associated with formation of the lower layer film.

The processing module 15 forms a resist film on the lower layer film by using the liquid processing units U1 and the heat processing units U2. The liquid processing units U1 of the processing module 15 apply a process liquid for forming the resist film onto the lower layer film. The heat processing units U2 of the processing module 15 perform various kinds of heat processing associated with formation of the resist film.

The processing module 16 forms an upper layer film on the resist film by using the liquid processing units U1 and the heat processing units U2. The liquid processing units U1 of the processing module 16 apply a liquid for forming the upper layer film onto the resist film. The heat processing units U2 of the processing module 16 perform various kinds of heat processing associated with formation of the upper layer film.

The processing module 17 performs a development process of the resist film after exposure by using the liquid processing units U1 and the heat processing units U2. The liquid processing units U1 of the processing module 17 perform the development process of the resist film by flush out a developer with a rinse liquid after the developer is applied onto a surface of the exposed wafer W. The heat processing units U2 of the processing module 17 perform various kinds of heat processing associated with the development process. Specific examples of the heat processing include a post exposure bake (PEB) before the development process, and a post bake (PB) after the development process.

A shelf unit U10 is provided on the carrier block 4 side in the processing block 5. The shelf unit U10 is divided into vertically arranged multiple cells. An elevating arm A7 is provided near the shelf unit U10. The elevating arm A7 elevates a wafer W between cells of the shelf unit U10.

A shelf unit U11 is provided on the interface block 6 side in the processing block 5. The shelf unit U11 is divided into vertically arranged multiple cells.

The interface block 6 delivers and receives the wafer W to and from the exposure device 3. For example, the interface block 6 incorporates a delivery arm A8 and is connected to the exposure device 3. The delivery arm A8 delivers a wafer W arranged on the shelf unit U11 to the exposure device 3, and receives a wafer W from the exposure device 3 and returns the wafer W to the shelf unit U11.

The controller 100 controls the application/development device 2, for example, so as to perform an application and development processes in the following steps. First, the controller 100 controls the delivery arm A1 so as to convey a wafer W in the carrier 11 to the shelf unit U10, and controls the elevating arm A7 so as to arrange the wafer W on the cell for the processing module 14.

Next, the controller 100 controls the conveying arm A3 so as to convey the wafer W on the shelf unit U10 to the liquid processing units U1 and the heat processing units U2 in the processing module 14, and controls the liquid processing units U1 and the heat processing units U2 so as to form a lower layer film on a surface of the wafer W. Then, the controller 100 controls the conveying arm A3 so as to return the wafer W, in which the lower layer film is formed, onto the shelf unit U10, and controls the elevating arm A7 so as to arrange the wafer W on the cell for the processing module 15.

Next, the controller 100 controls the conveying arm A3 so as to convey the wafer W on the shelf unit U10 to the liquid processing units U1 and the heat processing units U2 in the processing module 15, and controls the liquid processing units U1 and the heat processing units U2 so as to form a resist film on the lower layer film of the wafer W. Then, the controller 100 controls the conveying arm A3 so as to return the wafer W onto the shelf unit U10, and controls the elevating arm A7 so as to arrange the wafer W on the cell for the processing module 16.

Next, the controller 100 controls the conveying arm A3 so as to convey the wafer W on the shelf unit U10 to each unit in the processing module 16, and controls the liquid processing units U1 and the heat processing units U2 so as to form an upper layer film on the resist film of the wafer W. Then, the controller 100 controls the conveying arm A3 so as to return the wafer W onto the shelf unit U10, and controls the elevating arm A7 so as to arrange the wafer W on the cell for the processing module 17.

Next, the controller 100 controls the direct conveying arm A6 so as to convey the wafer W on the shelf unit U10 to the shelf unit U11, and controls the delivery arm A8 so as to send the wafer W to the exposure device 3. After that, the controller 100 controls the delivery arm A8 so as to receive the wafer W, which has been subject to an exposure process, from the exposure device 3 and return the wafer W to the shelf unit U11.

Next, the controller 100 controls the conveying arm A3 so as to convey the wafer W on the shelf unit U11 to each unit in the processing module 17, and controls the liquid processing units U1 and the heat processing units U2 so as to apply a development process to the resist film of the wafer W. After that, the controller 100 controls the conveying arm A3 so as to return the wafer W to the shelf unit U10, and controls the elevating arm A7 and the delivery arm A1 so as to return the wafer W into the carrier 11. The application and development processes are completed through the above-described steps.

A specific configuration of the substrate processing apparatus is not limited to the configuration of the application/development device 2 exemplified above. Any type of the substrate processing apparatus may be used as long as the apparatus includes a liquid processing unit U1 for a development process (a liquid processing unit U1 of the processing module 17) and a controller 100 which can control this liquid processing unit U1.

Development Unit

Figure 4:
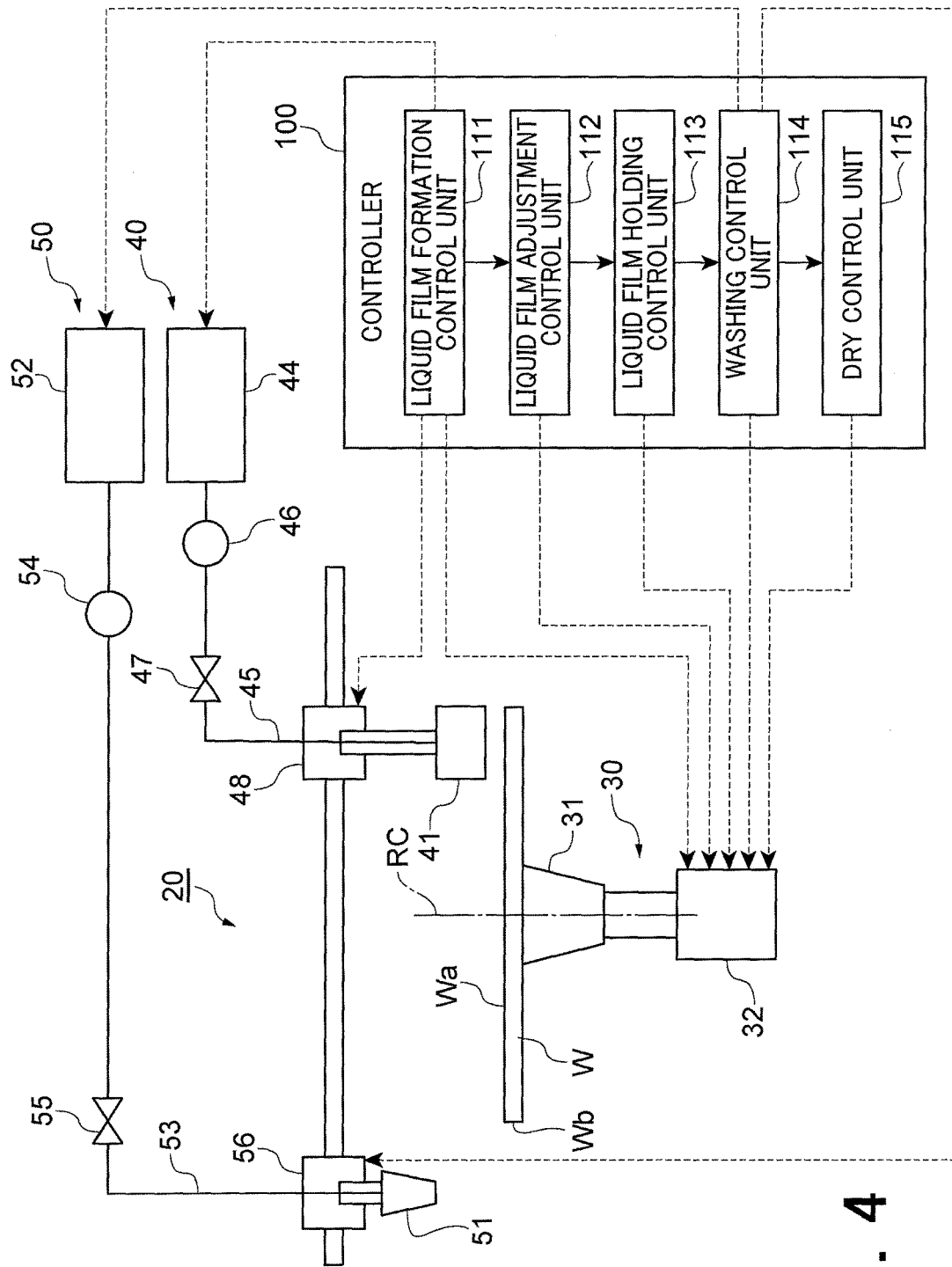
FIG. 4 is a schematic view illustrating a schematic configuration of a developing unit.

Next, the liquid processing unit U1 of the processing module 17 will be described in detail. The processing module 17 includes a development unit 20 as the liquid processing unit U1. As illustrated in FIG. 4, the development unit 20 includes a rotation holding unit 30 and a developer supply unit 40.

The rotation holding unit 30 rotates a substrate while holding the substrate. For example, the rotation holding unit 30 includes a holding mechanism 31 and a rotation mechanism 32. The holding mechanism 31 supports the center of the wafer W arranged horizontally and holds the wafer W by vacuum suction or another method. The rotation mechanism 32 incorporates, for example, an electric motor as a power source and rotates the holding mechanism 31 around a vertical rotation center RC. As a result, the wafer W rotates around the rotation center RC.

The developer supply unit 40 supplies a developer on a surface Wa of the wafer W. The developer is a process liquid for removing a portion to be removed on an exposed resist film. The portion to be removed on the resist film is a portion soluble in the developer after an exposure process.

In a case where the developer is a positive type, a portion exposed in the exposure process is soluble in the developer. In a case where the developer is a negative type, a portion which is not exposed in the exposure process is soluble in the developer. Specific examples of the positive type developer include an alkaline solution. Specific examples of the negative type developer include an organic solvent.

The developer supply unit 40 includes, for example, a nozzle 41, a tank 44, a pump 46, a valve 47, and a nozzle conveyance mechanism 48.

Figure 5:
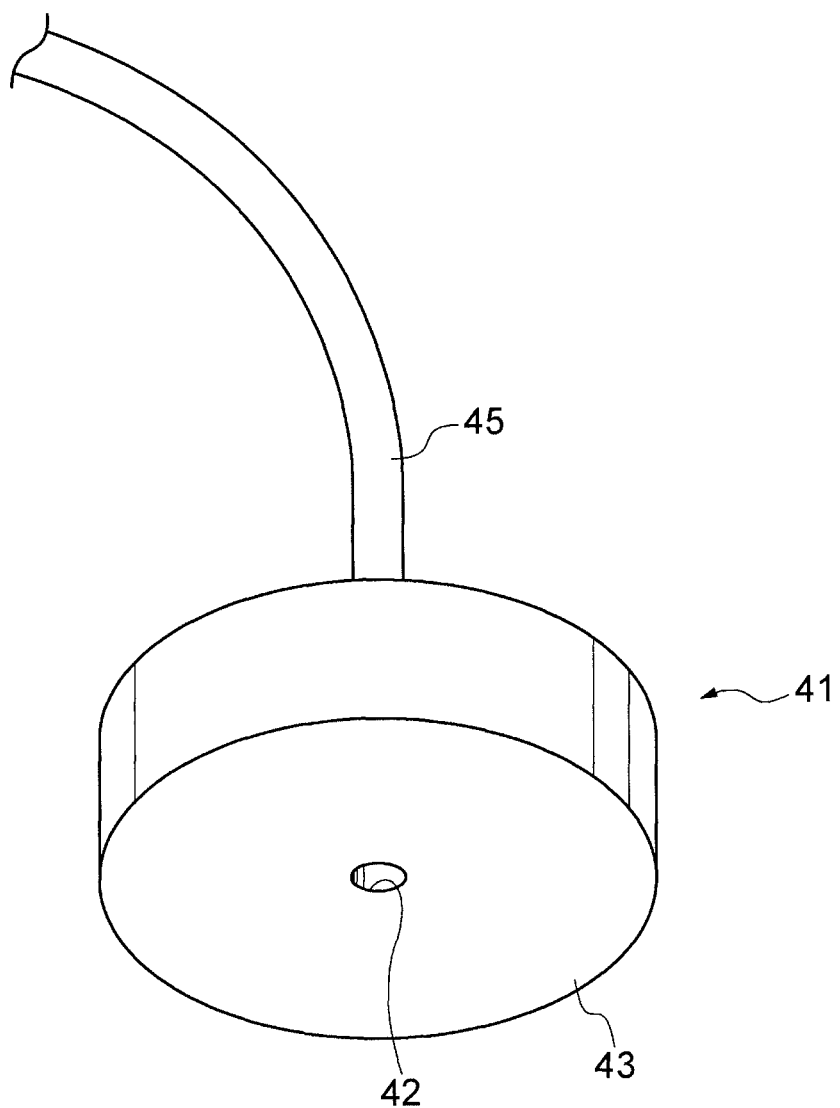
FIG. 5 is a perspective view illustrating an example of a nozzle.

The nozzle 41 discharges a developer toward the surface Wa of the wafer W. As illustrated in FIG. 5, the nozzle 41 has a discharge port 42 for the developer, and a liquid contact surface 43 formed around the discharge port 42. For example, the nozzle 41 includes a round liquid contact surface 43, and the discharge port 42 opens at the center of the liquid contact surface 43. The area of the liquid contact surface 43 is smaller than the area of the surface Wa of the wafer W. The area of the liquid contact surface 43 may be, for example, 1 to 11% of the area of the surface Wa of the wafer W, and may be 1 to 3%.

With reference to FIG. 4 again, the nozzle 41 is connected to the tank 44 via a pipeline 45. The tank 44 stores the developer. The pump 46 and the valve 47 are provided to the pipeline 45. The pump 46 is, for example, a bellows pump and force-feeds the developer from the tank 44 to the nozzle 41. The valve 47 is, for example, an air operation valve and adjusts an opening in the pipeline 45. By controlling the valve 47, the state in which the developer is discharged from the nozzle 41 and the state in which the developer is not discharged from the nozzle 41 can be switched. Further, by controlling at least one of the pump 46 and the valve 47, the discharge amount of the developer from the nozzle 41 can be adjusted.

The nozzle conveyance mechanism 48 conveys the nozzle 41 by using an electric motor or the like as a power source. Specifically, the nozzle conveyance mechanism 48 conveys the nozzle 41 so as to cross above the wafer W in a state in which the liquid contact surface 43 of the nozzle 41 faces downward.

The nozzle conveyance mechanism 48 may convey the nozzle 41 along a path passing through the rotation center RC of the wafer W, and may convey the nozzle 41 along a path deviated from the rotation center RC. The nozzle conveyance mechanism 48 may convey the nozzle 41 along a straight path, and may convey the nozzle 41 along a bending path.

The nozzle conveyance mechanism 48 may elevate the nozzle 41 in addition to conveying the nozzle 41 as described above. In other words, the nozzle conveyance mechanism 48 may include a mechanism to convey the nozzle 41 so as to cross above the wafer W by using an electric motor or the like as a power source, and a mechanism to move up and down the nozzle 41 by using an electric motor or the like as a power source.

A rinse liquid supply unit 50 supplies a rinse liquid onto the surface Wa of the wafer W. The rinse liquid is a process liquid to wash out the developer and may be deionized water for example.

The rinse liquid supply unit 50 includes, for example, a nozzle 51, a tank 52, a pump 54, a valve 55, and a nozzle conveyance mechanism 56.

The nozzle 51 discharges a rinse liquid toward the surface Wa of the wafer W. The nozzle 51 is connected to the tank 52 via a pipeline 53.

The tank 52 stores the rinse liquid. The pump 54 and the valve 55 are provided to the pipeline 53. The pump 54 is, for example, a bellows pump and force-feeds the rinse liquid from the tank 52 to the nozzle 51. The valve 55 is, for example, an air operation valve, and adjusts an opening in the pipeline 53. By controlling the valve 55, the state in which the rinse liquid is discharged from the nozzle 51 and the state in which the rinse liquid is not discharged from the nozzle 51 can be switched. Further, by controlling at least one of the pump 54 and the valve 55, the discharge amount of the rinse liquid from the nozzle 51 can be adjusted.

The nozzle conveyance mechanism 56 conveys the nozzle 51 by using an electric motor or the like as a power source. Specifically, the nozzle conveyance mechanism 56 conveys the nozzle 51 so as to cross above the wafer W in a state in which the discharge port of the nozzle 51 faces downward.

The development unit 20 formed in this manner is controlled by the above-described controller 100. The controller 100 is configured to perform the following controls. Specifically, the controller 100 controls the rotation holding unit 30 so as to rotate the wafer W at a first rotation speed, supplies a developer on the surface Wa from the discharge port 42 in a state in which the liquid contact surface 43 faces the surface Wa, and moves the nozzle 41 while the liquid contact surface 43 is in contact with the developer, in such a manner that a liquid film of the developer is formed on the surface Wa; controls, after the liquid film is formed on the surface Wa, the rotation holding unit 30 so as to rotate the wafer W at a second rotation speed which is slower than the first rotation speed in a state in which the supply of the developer from the discharge port 42 is stopped; controls, after the wafer W is rotated at the second rotation speed, the rotation holding unit 30 so as to rotate the wafer W at a third rotation speed which is faster than the first rotation speed; and controls, after rotating the wafer W at the third rotation speed, the rotation holding unit 30 so as to rotate the wafer W at the second rotation speed or less in such a manner that the liquid film is held on the surface Wa.

For example, the controller 100 includes, as a functional configuration (hereinafter called "a functional module"), a liquid film formation control unit 111, a liquid film adjustment control unit 112, a liquid film holding control unit 113, a washing control unit 114, and a dry control unit 115. The liquid film formation control unit 111 controls the rotation holding unit 30 and the developer supply unit 40 so as to form a liquid film of the developer on the surface Wa. The liquid film adjustment control unit 112 controls the rotation holding unit 30 so as to adjust the state of the liquid film formed on the surface Wa by changing the rotation speed of the wafer W. The liquid film holding control unit 113 controls the rotation holding unit 30 so as to hold a liquid film on the surface Wa by reducing a rotation speed of the wafer W. The washing control unit 114 controls the rotation holding unit 30 and the rinse liquid supply unit 50 so as to wash out a developer by supplying a rinse liquid on the surface Wa while rotating the wafer W. The dry control unit 115 controls the rotation holding unit 30 so as to shake off liquid on the surface Wa by rotating the wafer W.

The controller 100 is configured by, for example, one computer for control or a plurality of computers for control. In this case, each functional module of the controller 100 is formed by collaboration of a processor and a memory, and the like, of the computer(s) for control. A program to cause the computer for control to function as the controller 100 may be recorded in a non-transitory computer-readable medium. In this case, the non-transitory computer-readable medium stores a program to cause an apparatus to perform a substrate processing method described later. Examples of the non-transitory computer-readable medium include a hard disk, a compact disk, a flash memory, a flexible disk, and a memory card.

A hardware included in each functional module of the controller 100 is not necessarily limited to a processor and a memory. For example, each element of the controller 100 may be configured by an electric circuit specialized to the function, and may be configured by an application specific integrated circuit (ASIC) in which such electric circuits are integrated.

Development Process Procedure

As an example of the substrate processing method, a development process procedure to be performed by the application/development device 2 will be described next. The procedure described below is a procedure which is after the wafer W before a development process is conveyed into the development unit 20 by the conveying arm A3 and held by the holding mechanism 31, and which is until before the wafer W after the development process is conveyed out from the development unit 20 by the conveying arm A3. This procedure is performed by controlling each unit of the development unit 20 with the controller 100.

Figure 6:
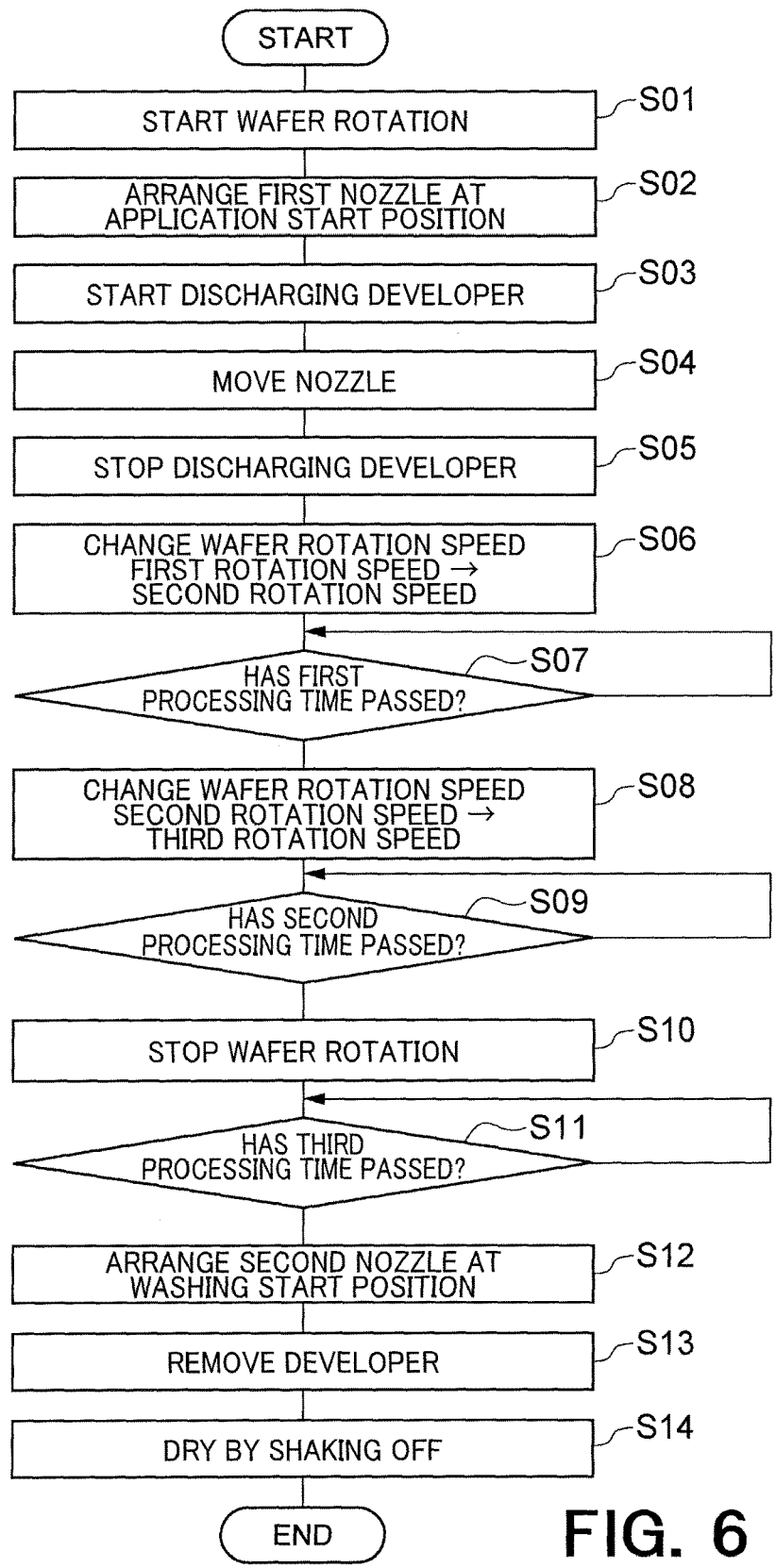
FIG. 6 is a flowchart of a development process procedure.

As illustrated in FIG. 6, the controller 100 first performs steps S01 to S05 in order. In step S01, the rotation holding unit 30 is controlled in such a manner that the rotation holding unit 30 starts rotating the wafer W, and the wafer W is rotated at a first rotation speed $\omega 1$ (see FIG. 7A). The first rotation speed $\omega 1$ is a rotation speed at which the developer supplied on the surface Wa remains on the surface Wa without being shaken off by the centrifugal force. The first rotation speed $\omega 1$ can be appropriately set by preliminary setting conditions. The first rotation speed $\omega 1$ may be, for example, 40 to 90 rpm and may be 55 to 65 rpm.

In step S02, the liquid film formation control unit 111 controls the developer supply unit 40 in such a manner that the nozzle 41 is arranged at a position where application of the developer starts. The liquid film formation control unit 111 controls the developer supply unit 40 so as to cause the nozzle conveyance mechanism 48 to convey the nozzle 41 in such a manner that the liquid contact surface 43 faces a region on the surface Wa where the developer is applied first. The region on the surface Wa where the developer is applied first may be a region on the outer peripheral Wb side of the wafer W. The region on the outer peripheral Wb side is a region which is eccentric on one point side on the outer peripheral Wb within the surface Wa.

Figure 7A:
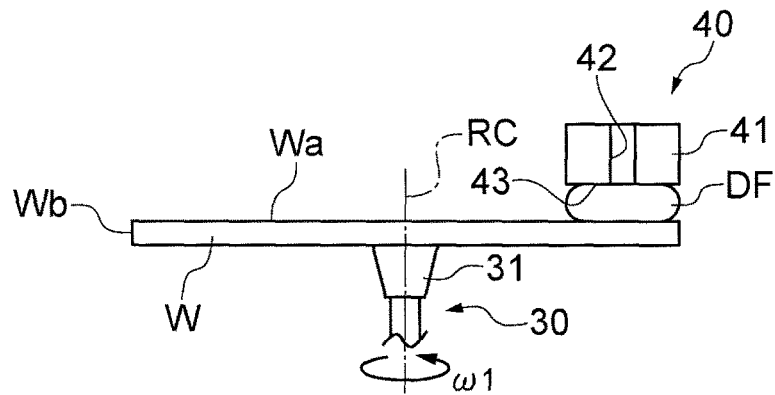
FIGS. 7A to 7C are schematic views illustrating a state of a substrate while a liquid film is formed.

In step S03, the liquid film formation control unit 111 controls the developer supply unit 40 in such a manner that a developer DF is supplied from the tank 44 to the nozzle 41 and discharge of the developer DF from the nozzle 41 is started (see FIG. 7A).

Figure 7B:
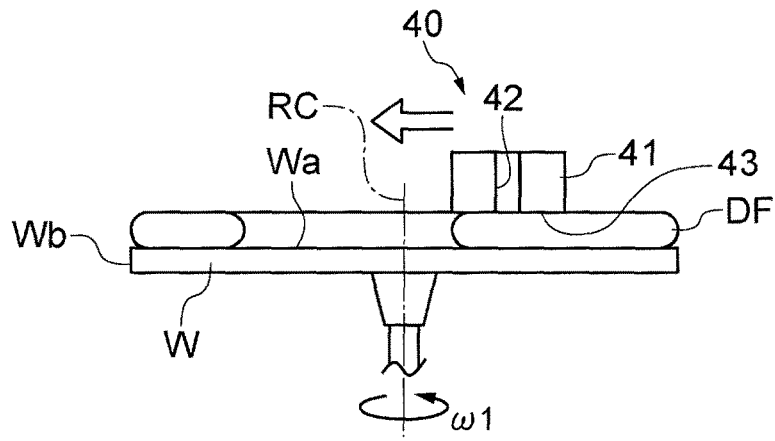
Figure 7C:
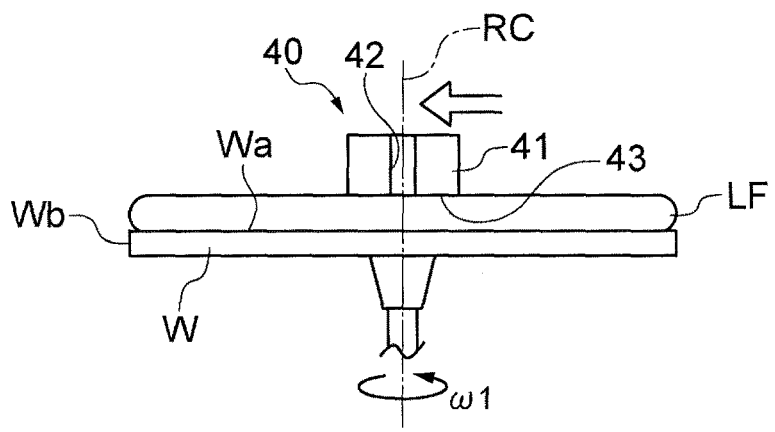

In step S04, the liquid film formation control unit 111 controls the developer supply unit 40 in such a manner that the nozzle 41 is moved by the nozzle conveyance mechanism 48 while the liquid contact surface 43 is in contact with the developer DF, so as to form a liquid film LF of the developer DF on the surface Wa (see FIGS. 7B and 7C). For example, the liquid film formation control unit 111 controls the developer supply unit 40 in such a manner that the nozzle 41 is moved along a path crossing above the surface Wa. As a result, the developer DF is spirally applied onto the surface Wa, and the liquid film LF is formed.

The liquid film formation control unit 111 may control the developer supply unit 40 in such a manner that the nozzle 41 is moved from the outer peripheral Wb side of the wafer W, to the rotation center RC side.

The liquid film formation control unit 111 may control the developer supply unit 40 so as to change the moving speed of the nozzle 41 while the nozzle 41 is moved. For example, the liquid film formation control unit 111 may control the developer supply unit 40 so as to reduce the moving speed of the nozzle 41 as the discharge port 42 approaches the rotation center RC.

The liquid film formation control unit 111 may control the developer supply unit 40 so as to change the discharge amount of the developer DF from the discharge port 42 while the nozzle 41 is moved. For example, the liquid film formation control unit 111 may control the developer supply unit 40 so as to increase the discharge amount of the developer DF from the discharge port 42 as the discharge port 42 approaches the rotation center RC.

The liquid film formation control unit 111 may control the developer supply unit 40 in such a manner that the nozzle 41 is moved under the condition that a position where the discharge port 42 coincides with the rotation center RC is treated as the end point. Specifically, the liquid film formation control unit 111 may control the developer supply unit 40 in such a manner that movement of the nozzle 41 is stopped when the discharge port 42 arrives at the rotation center RC.

Figure 8A:
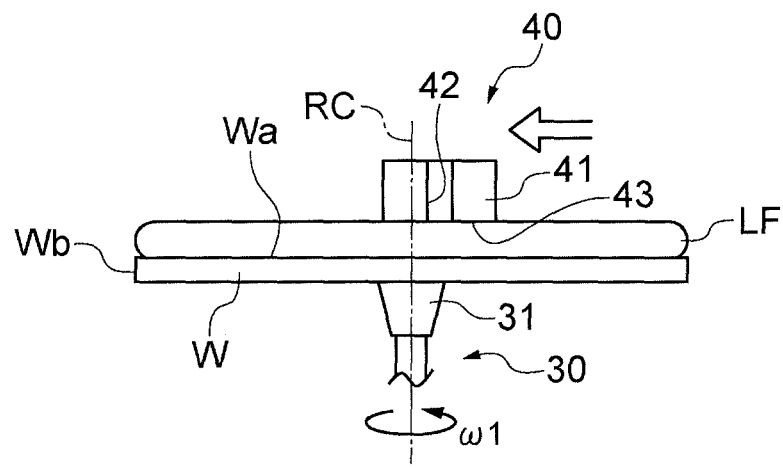
FIGS. 8A and 8B are schematic views illustrating a state of the substrate while the liquid film is formed.
Figure 8B:
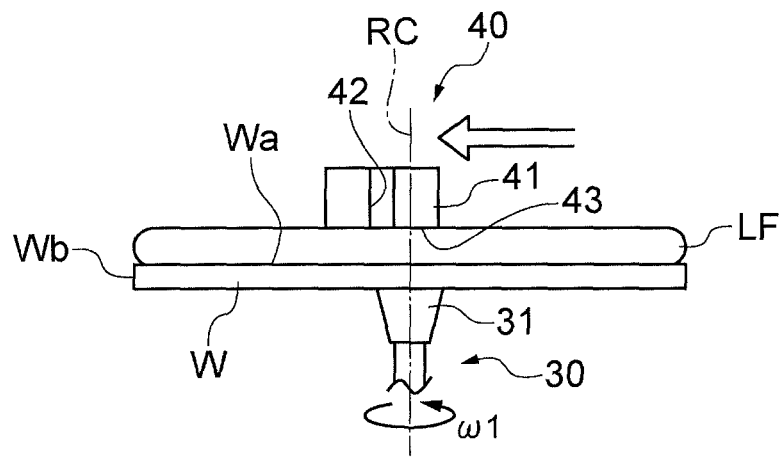

The liquid film formation control unit 111 may control the developer supply unit 40 in such a manner that the nozzle 41 is moved under the condition that a position where the discharge port 42 deviates from the rotation center RC is treated as the end point. For example, the liquid film formation control unit 111 may stop movement of the nozzle 41 before the discharge port 42 arrives at the rotation center RC (see FIG. 8A), and may move the nozzle 41 until the discharge port 42 passes through the rotation center RC (see FIG. 8B). In either case, the liquid film formation control unit 111 may set a position, as the end point, where the discharge port 42 deviates from the rotation center RC and also the rotation center RC passes on the liquid contact surface 43.

In step S05, the liquid film formation control unit 111 controls the developer supply unit 40 in such a manner that discharge of the developer DF from the nozzle 41 is stopped.

Next, the controller 100 performs steps S06 to S09 in order. In step S06, the liquid film adjustment control unit 112 controls the rotation holding unit 30 so as to change the rotation speed of the wafer W from the first rotation speed $\omega 1$ to the second rotation speed $\omega 2$. The second rotation speed $\omega 2$ is slower than the first rotation speed $\omega 1$. The second rotation speed $\omega 2$ can be appropriately set by preliminary setting condition. The second rotation speed $\omega 2$ may be, for example, 0 to 20 rpm and may be 5 to 15 rpm. As exemplified herein, the second rotation speed $\omega 2$ may be zero (0). Specifically, changing from the first rotation speed $\omega 1$ to the second rotation speed $\omega 2$ includes stopping rotation of the wafer W.

In step S07, the liquid film adjustment control unit 112 waits until a first processing time passes in a state where the state after performing step S06 (i.e., the state in which the rotation speed of the wafer W is the second rotation speed $\omega 2$) is kept. The first processing time can be appropriately set by preliminarily setting conditions. The first processing time is, for example, 1 to 2 seconds.

In step S08, the liquid film adjustment control unit 112 controls the rotation holding unit 30 so as to change the rotation speed of the wafer W from the second rotation speed $\omega 2$ to the third rotation speed $\omega 3$. The third rotation speed $\omega 3$ is faster than the first rotation speed $\omega 1$.

More specifically, the third rotation speed $\omega 3$ is a rotation speed at which a part of the developer DF forming the liquid film LF is moved to the outer peripheral Wb side of the wafer W by the centrifugal force. The third rotation speed $\omega 3$ can be appropriately set by preliminary setting conditions. The third rotation speed $\omega 3$ may be, for example, 90 to 200 rpm and may be 80 to 120 rpm.

In step S09, the liquid film adjustment control unit 112 waits until a second processing time passes in a state where the state after performing step S08 (i.e., the state in which the rotation speed of the wafer W is the third rotation speed $\omega 3$) is kept. The second processing time can be appropriately set by preliminary setting conditions. The second processing time is, for example, 1 to 2 seconds.

By steps S06 to S09, uniformity of the film thickness of the liquid film LF and the concentration of the developer DF in the liquid film LF is increased. The concentration of the developer DF means the concentration of a component of the developer DF which contributes to a development process.

With reference to FIGS. 9A to 9D, a phenomenon occurring on the liquid film LF by performing steps S06 to S09 will be described. In a process to form the liquid film LF, in a case where the nozzle 41 is moved from the outer peripheral Wb side to the rotation center RC side of the wafer W as described above, supply of the developer onto the outer peripheral Wb side is performed prior to supply of the developer onto the rotation center RC side. As a result, the developer DF supplied onto the outer peripheral Wb side deteriorates at an earlier stage in comparison with the developer supplied onto the rotation center RC side, and therefore, immediately after the liquid film LF is formed, freshness of the developer becomes higher as the developer approaches the rotation center RC. The deterioration of the developer means that the concentration of the developer is decreased due to the progress of the development process and the like, and the freshness of the developer means how low the deterioration level of the developer is.

Figure 9A:
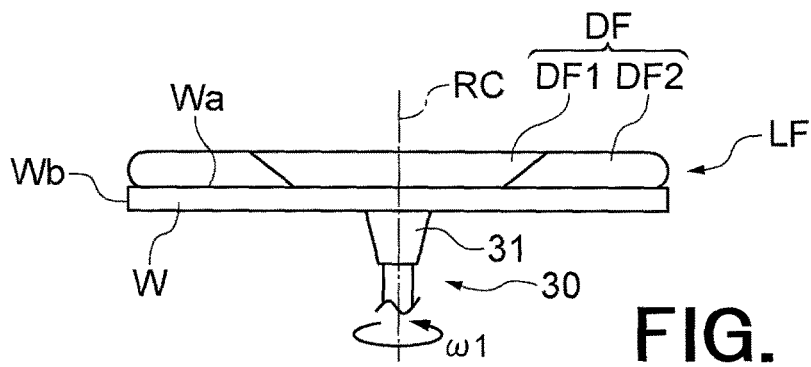
FIGS. 9A to 9D are schematic views illustrating a state of the substrate while a liquid concentration is adjusted.

To schematically indicate a state of the developer DF in the liquid film LF, FIGS. 9A to 9D illustrate the developer DF in the liquid film LF by dividing it into a fresh developer DF1 and a deteriorated developer DF2. As illustrated in FIG. 9A, immediately after the liquid film LF is formed, the freshness of the developer is increased as the developer approaches the rotation center RC.

Figure 9B:
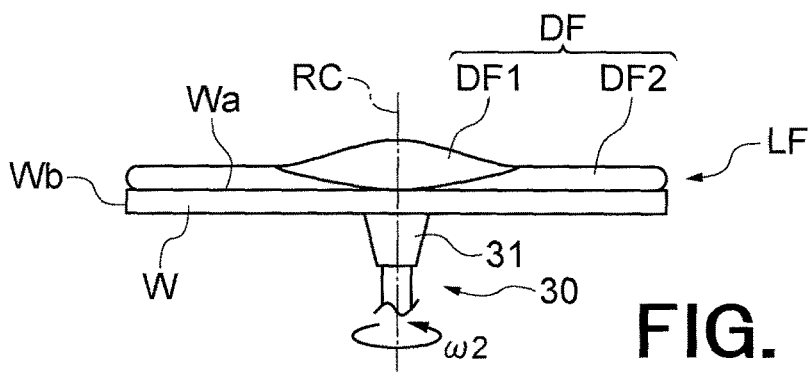
Figure 9C:
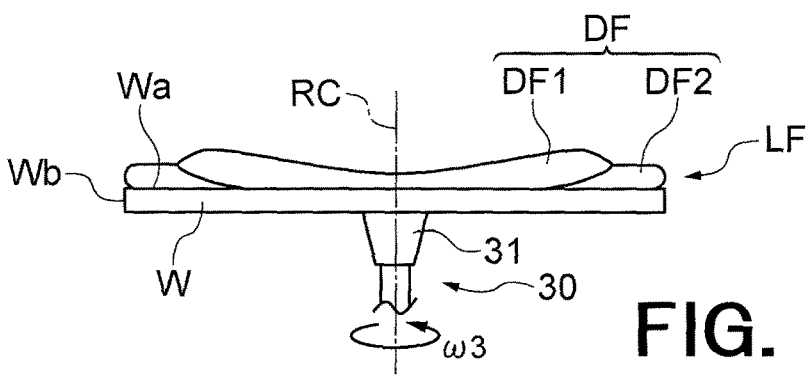
Figure 9D:
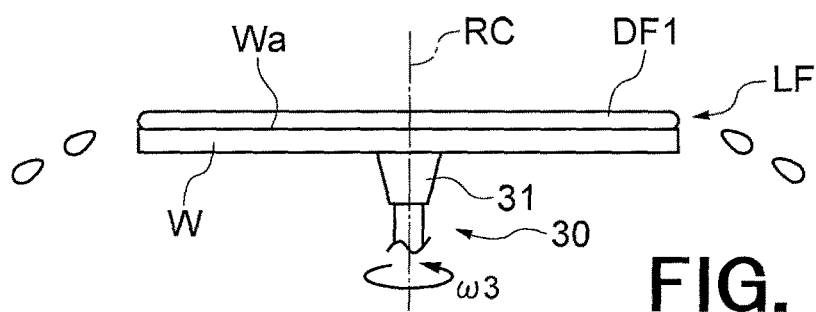

In the above-described steps S06 and S07, when the first rotation speed $\omega 1$ is changed to the second rotation speed $\omega 2$, the developer DF approaches the rotation center RC side as illustrated in FIG. 9B. Consequently, the fresh developer DF1 gathers on the rotation center RC side. After that, in steps S08 and S09, when the second rotation speed $\omega 2$ is changed to the third rotation speed $\omega 3$, the developer DF spreads towards the outer peripheral Wb side as illustrated in FIGS. 9C and 9D, and the excessive developer DF is shaken off to the outer peripheral side. As a result, the fresh developer DF1 spreads to the outer peripheral Wb side, and the deteriorated developer DF2 is replaced with the fresh developer DF1. Accordingly, uniformity of the film thickness of the liquid film LF and the concentration of the developer DF in the liquid film LF is increased.

Step S06 may be performed prior to step S05. Step S05 is performed at least before step S07 is completed. Specifically, at least a part of the period in which the wafer W is rotated at the second rotation speed $\omega 2$ is after supply of the developer DF1 is stopped.

During the period until step S07 is completed after step S04 is performed, the liquid film adjustment control unit 112 may further control the developer supply unit 40 so as to move up the nozzle 41 to distance the liquid contact surface 43 from the wafer W. Specifically, a development process procedure performed by the application/development device 2 may further include distancing the liquid contact surface 43 from the wafer W before rotation of the wafer W at the second rotation speed $\omega 2$ is completed after the liquid film LF is formed on the wafer W. The liquid contact surface 43 may be distanced from the wafer W before or after step S05, or before or after step S06.

Figure 10A:
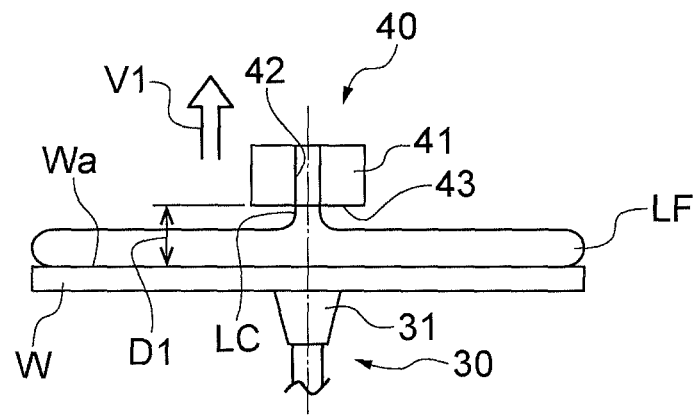
FIGS. 10A and 10B are schematic views illustrating a state of a nozzle when being distanced from the liquid film.
Figure 10B:
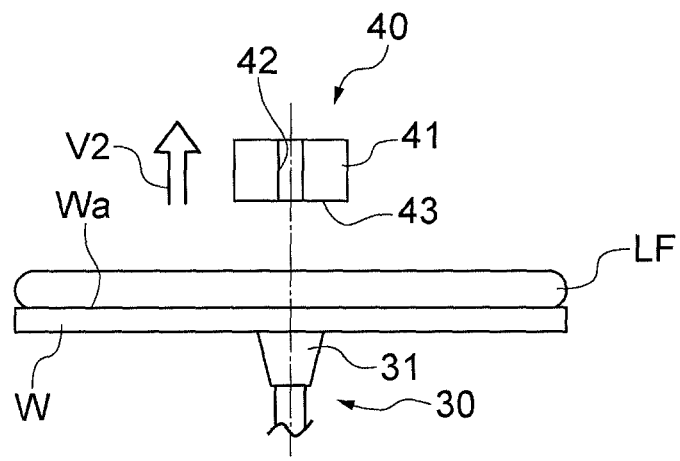

Distancing the liquid contact surface 43 from the wafer W may include: distancing the liquid contact surface 43 by a first distance D1 from the surface Wa at a first speed V1 (see FIG. 10A); and further distancing the liquid contact surface 43 at a second speed V2 which is slower than the first speed V1 after a state is held in which the liquid contact surface 43 is separated from the surface Wa by the first distance D1 (see FIG. 10B). Specifically, when the liquid contact surface 43 is distanced from the wafer W, the liquid film adjustment control unit 112 may control the developer supply unit 40 in such a manner that the liquid contact surface 43 is separated from the surface Wa by the first distance D1, and after that state is held, the liquid contact surface 43 is further distanced at the second speed V2 which is slower than the first speed V1.

The first distance D1 may be a distance such that a liquid column LC is formed between the liquid film LF and the liquid contact surface 43 (see FIG. 10A). That distance can be appropriately set by preliminary setting conditions.

With reference to FIG. 6, the controller 100 then performs steps S10 and S11. In step S10, the liquid film holding control unit 113 controls the rotation holding unit 30 in such a manner that the liquid film LF is held on the surface Wa by reducing the rotation speed of the wafer W to the second rotation speed $\omega 2$ or less. As an example thereof, the liquid film holding control unit 113 may control the rotation holding unit 30 so as to stop rotation of the wafer W.

In step S11, the liquid film holding control unit 113 waits until a third processing time passes in a state where the state after performing step S10 (i.e., the state in which the rotation speed of the wafer W is the second rotation speed $\omega 2$ or less) is kept. During this period, development further proceeds due to the developer DF in the liquid film LF. The third processing time can be appropriately set by preliminary setting conditions. The third processing time may be, for example, 10 to 30 seconds and may be 15 to 25 seconds.

Next, the controller 100 performs steps S12 to S14 in order. In step S12, the nozzle 51 is conveyed by the nozzle conveyance mechanism 56, and the washing control unit 114 controls the rinse liquid supply unit 50 so as to arrange the nozzle 51 on the rotation center RC of the wafer W.

Figure 11A:
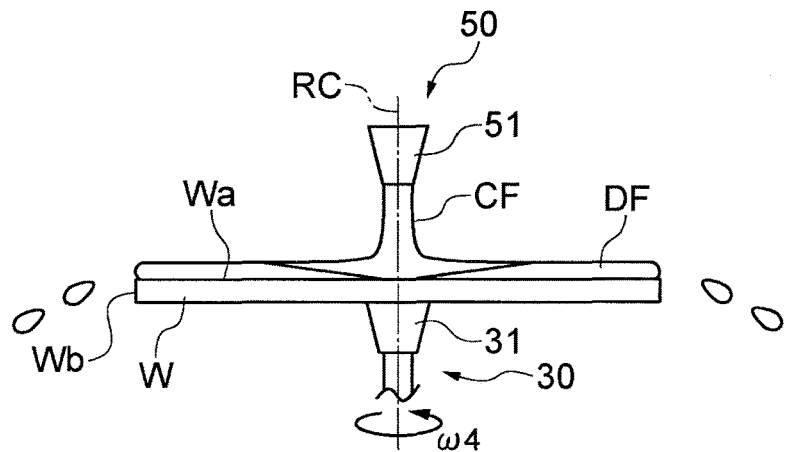
FIGS. 11A to 11C are schematic views illustrating a state of the substrate while a rinse liquid is supplied.
Figure 11B:
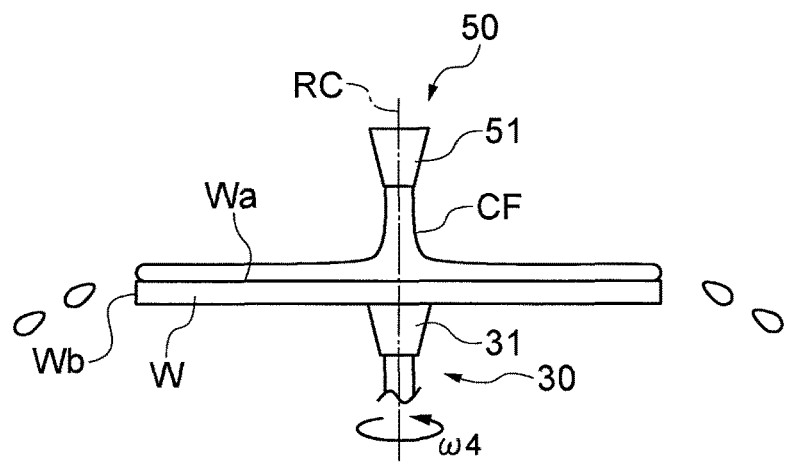

In step S13, the washing control unit 114 controls the rotation holding unit 30 and the rinse liquid supply unit 50 so as to wash out the developer DF on the surface Wa. For example, the washing control unit 114 controls the rinse liquid supply unit 50 so as to send the rinse liquid CF from the tank 52 to the nozzle 51 to supply the rinse liquid CF onto the central part of the surface Wa while controlling the rotation holding unit 30 so as to rotate the wafer W at a fourth rotation speed $\omega 4$ which is faster than the third rotation speed $\omega 3$ (see FIG. 11A). The fourth rotation speed $\omega 4$ can be appropriately set by preliminary setting conditions. The fourth rotation speed $\omega 4$ is, for example, 500 to 2000 rpm. The rinse liquid CF supplied onto the surface Wa spreads to the outer peripheral Wb side by the centrifugal force and washes out the developer DF (see FIG. 11B).

Then, the washing control unit 114 controls the rinse liquid supply unit 50 so as to stop supplying the rinse liquid CF.

Figure 11C:
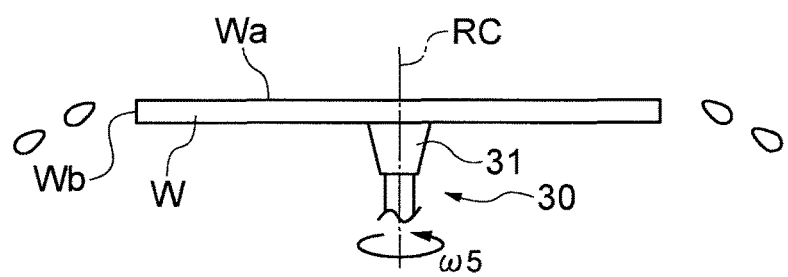

In step S14, the dry control unit 115 controls the rotation holding unit 30 so as to remove liquid on the surface Wa. For example, the dry control unit 115 controls the rotation holding unit 30 so as to rotate the wafer W at a fifth rotation speed ω5 which is faster than the fourth rotation speed ω4 (see FIG. 11C). The fifth rotation speed ω5 is, for example, 1500 to 3000 rpm. As described above, the development process procedure is completed.

Effects of the Present Embodiment

The development process procedure according to the present embodiment includes: supplying the developer onto the surface Wa from the discharge port 42 in a state in which the wafer W is rotated at the first rotation speed and the liquid contact surface 43 faces the surface Wa, and moving the nozzle 41 while the liquid contact surface 43 is in contact with the developer in such a manner that a liquid film of the developer is formed on the surface Wa; rotating the wafer W at the second rotation speed which is slower than the first rotation speed, after the liquid film is formed on the surface Wa, in a state in which supply of the developer from the discharge port is stopped; rotating the wafer W at the third rotation speed which is faster than the first rotation speed, after the wafer W is rotated at the second rotation speed; and reducing the rotation speed of the wafer W to the second rotation speed or less, after the wafer W is to rotated at the third rotation speed, in such a manner that the liquid film is held on the surface Wa.

According to this development process procedure, in the process to form a liquid film, the liquid contact surface 43 is in contact with the developer supplied from the discharge port 42 to the surface Wa. Due to the relative motion between the liquid contact surface 43 and the surface Wa, the developer is stirred therebetween. Therefore, uniformity of the development progress speed between the liquid contact surface 43 and the surface Wa is improved.

After the liquid film is formed, the rotation speed of the wafer W is decreased from the first rotation speed to the second rotation speed and then increased to the third rotation speed which is faster than the first rotation speed. When the rotation speed of the wafer W is decreased from the first rotation speed to the second rotation speed, the developer approaches the rotation center RC side of the wafer W, and when the rotation speed of the wafer W is increased from the second rotation speed to the third rotation speed, the developer spreads onto the outer peripheral Wb side of the wafer W. Since the developer approaches the rotation center RC side once before the developer spreads onto the outer peripheral Wb side, a kinetic energy of the developer is increased when the developer spreads onto the outer peripheral Wb side. Therefore, the developer on the rotation center RC side further certainly spreads over the outer peripheral Wb side. As a result, in a state in which uniformity of the film thickness of the liquid film and the concentration of the developer in the liquid film is increased, the liquid film is held on the surface Wa. Therefore, even after the liquid film is formed, the uniformity of the development progress speed is increased.

As described above, since the uniformity of the development progress speed is increased both in the liquid film formation process and after the formation of a liquid film, the development progress amount can be further certainly suppressed from varying according to a position on the substrate.

When the liquid film is formed on the surface Wa by moving the nozzle 41 in a state in which the liquid contact surface 43 is in contact with the developer, the nozzle 41 may be moved from the outer peripheral Wb side to the rotation center RC side. In this case, the developer is supplied to the rotation center RC side after the developer is supplied onto the outer peripheral Wb side. Therefore, immediately after the liquid film is formed, freshness of the developer is increased towards the rotation center RC. Therefore, when the wafer W is rotated at the third rotation speed, the developer with low freshness on the outer peripheral Wb side is replaced with the developer with high freshness on the rotation center RC side. In response to the freshness of the developer being increased, uniformity of the concentration of the developer has a tendency to increase. Therefore, by replacing the developer with low freshness with the developer with high freshness, the uniformity of the concentration of the developer in the liquid film is further increased. As a result, the uniformity of the development progress speed can be further increased.

After the liquid film is formed on the surface Wa, the liquid contact surface 43 may be distanced from the surface Wa before rotation of the wafer W at the second rotation speed is completed. In this case, by expanding the space between the liquid contact surface 43 and the surface Wa before the rotation of the wafer W at the second rotation speed is completed, the developer in the liquid film can further certainly approach the rotation center RC side. Therefore, when the wafer W is rotated at the third rotation speed, uniformity of the film thickness of the liquid film and the concentration of the developer in the liquid film can be further increased.

Distancing the liquid contact surface 43 from the surface Wa may include: distancing the liquid contact surface 43 from the surface Wa by a first distance at the first speed; and further distancing the liquid contact surface 43 at the second speed which is slower than the first speed, after holding a state in which the liquid contact surface 43 is separated from the surface Wa by the first distance. In this case, by holding the distance between the liquid contact surface 43 and the surface Wa after the liquid contact surface 43 is distanced from the surface Wa by the first distance at the first speed, the contact surface between the liquid contact surface 43 and the liquid film is reduced. Then, by further distancing the liquid contact surface 43 at the second speed which is slower than the first speed, tear-off of the developer is suppressed when the liquid contact surface 43 is distanced from the liquid film. Thus, when the liquid contact surface 43 is distanced from the liquid film, the developer does not easily remain on the liquid contact surface 43, and therefore the developer separated from the liquid film is suppressed from dripping from the liquid contact surface 43. Therefore, when the wafer W is rotated at the third rotation speed, uniformity of the film thickness of the liquid film and the concentration of the developer in the liquid film can be further increased.

The first distance may be a distance such that a liquid column is formed between the developer liquid film and the liquid contact surface 43.

In this case, in a state in which tear-off of the developer is prevented in a process to distance the liquid contact surface 43 from the surface Wa by the first distance, the contact surface between the liquid contact surface 43 and the liquid film is further certainly reduced. Therefore, when the liquid contact surface 43 is distanced from the liquid film, the developer can be further certainly prevented from remaining on the liquid contact surface 43.

When the liquid film is formed on the surface Wa by moving the nozzle 41 while the liquid contact surface 43 is in contact with the developer, the moving speed of the nozzle 41 may be changed in middle. In this case, by changing the moving speed of the nozzle 41, the amount of the developer on the rotation center RC side of the liquid film can be more certainly optimized. Therefore, when the wafer W is rotated at the third rotation speed, uniformity of the film thickness of the liquid film and the concentration of the developer in the liquid film can be further certainly increased.

When the liquid film is formed on the surface Wa by moving the nozzle 41 while the liquid contact surface 43 is in contact with the developer, the moving speed of the nozzle 41 may be reduced as the discharge port 42 approaches the rotation center RC. In this case, immediately after the liquid film is formed, the amount of the developer on the rotation center RC side of the liquid film is increased in comparison with the amount of the developer on the outer peripheral Wb side of the liquid film. Therefore, when the wafer W is rotated at the third rotation speed, the developer on the rotation center RC side further certainly spreads over the outer peripheral Wb side, and therefore uniformity of the film thickness of the liquid film and the concentration of the developer in the liquid film can be further certainly increased.

When a liquid film is formed on the surface of the substrate by moving the nozzle 41 while the liquid contact surface 43 is in contact with the developer, the discharge amount of the developer from the discharge port 42 may be changed in middle. In this case, by changing the discharge amount of the developer from the discharge port 42, the amount of the developer on the rotation center RC side of the liquid film can be more certainly optimized. Therefore, when the wafer W is rotated at the third rotation speed, uniformity of the film thickness of the liquid film and the concentration of the developer in the liquid film can be further certainly increased.

When the liquid film is formed on the surface Wa by moving the nozzle 41 in a state in which the liquid contact surface 43 is in contact with the developer, the discharge amount of the developer from the discharge port 42 may be increased as the discharge port 42 approaches the rotation center RC. In this case, immediately after the liquid film is formed, the amount of the developer on the rotation center RC side of the liquid film is increased in comparison with the amount of the developer on the outer peripheral Wb side of the liquid film. Therefore, when the wafer W is rotated at the third rotation speed, the developer on the rotation center RC side further certainly spreads over the outer peripheral Wb side, and therefore uniformity of the film thickness of the liquid film and the concentration of the developer in the liquid film can be further certainly increased.

When the liquid film is formed on the surface Wa by moving the nozzle 41 while the liquid contact surface 43 is in contact with the developer, the nozzle 41 may be moved under the condition that a position where the discharge port deviates from the rotation center RC is treated as the end point. In this case, the amount of the developer on the rotation center RC side of the liquid film can be adjusted in accordance with the position where movement of the nozzle 41 is stopped. For example, by stopping the movement of the nozzle 41 before the discharge port 42 arrives at the rotation center of the wafer W, the amount of the developer can be reduced on the rotation center RC side. On the other hand, by moving the nozzle 41 until the discharge port 42 passes through the rotation center RC, the amount of the developer can be increased on the rotation center RC side of the liquid film. Therefore, the amount of the developer on the rotation center RC side of the liquid film can be further certainly optimized in accordance with the position where the movement of the nozzle 41 is stopped. Therefore, when the wafer W is rotated at the third rotation speed, uniformity of the film thickness of the liquid film and the concentration of the developer in the liquid film can be further certainly increased.

When the liquid film is formed on the surface Wa by moving the nozzle 41 while the liquid contact surface 43 is in contact with the developer, the nozzle 41 may be moved under the condition that a position where the discharge port 42 deviates from the rotation center RC and the rotation center RC passes on the liquid contact surface 43 is treated as the end point. In this case, even in a case where movement of the nozzle 41 is stopped at a position where the discharge port 42 deviates from the rotation center RC, the extent which the liquid contact surface 43 of the nozzle 41 faces covers all over the surface Wa. Therefore, the developer can be further certainly applied to the surface Wa until the rotation center RC. Therefore, when the wafer W is rotated at the third rotation speed, uniformity of the film thickness of the liquid film and the concentration of the developer in the liquid film can be further certainly increased.

When the liquid film is formed on the surface Wa by moving the nozzle 41 while the liquid contact surface 43 is in contact with the developer, the nozzle 41 may be moved until the discharge port 42 passes through the rotation center RC. In this case, immediately after the liquid film is formed, the amount of the developer on the rotation center RC side of the liquid film is increased in comparison with the amount of the developer on the outer peripheral Wb side of the liquid film. Therefore, when the wafer W is rotated at the third rotation speed, the developer on the rotation center RC side further certainly spreads over the outer peripheral Wb side, and therefore uniformity of the film thickness of the liquid film and the concentration of the developer in the liquid film can be further certainly increased.

Embodiments have been described above. However, the present invention is not necessarily limited to the above-described embodiments, and various modifications are possible within the gist of the present invention. For example, in the above-described embodiments, a case is exemplified where the nozzle 41 is moved from the outer peripheral Wb side to the rotation center RC side when a liquid film is formed on the surface Wa of the wafer W. However, the nozzle 41 may be moved from the rotation center RC side to the outer peripheral Wb side when a liquid film is formed on the surface Wa of the wafer W.

A substrate to be processed is not limited to a semiconductor wafer, and examples of the substrate include a glass substrate, a mask substrate, and a flat panel display (i.e., FPD).

EXAMPLES

A practical example and comparison examples of the development process procedure will be described below. Please note that the present invention is not limited to the examples described herein.

Preparation for Wafer Sample

A resist film was formed on each of a plurality of wafers W, and an exposure process was performed on the resist film by a step-and-repeat method. The exposure conditions in each shot were set so as to form linear patterns having approximately 45 nm width at equal intervals.

First Practical Example

The development process according to the above-described embodiment was performed on the exposed wafer W, and a resist pattern was formed on the surface Wa of the wafer W.

First Comparison Example

The above-described steps S06 and S07 were omitted. The other steps were performed as in the first practical example, and a resist pattern was formed on the surface Wa of the wafer W. Specifically, in the first comparison example, after a liquid film was formed, the rotation speed of the wafer W was not decreased to the second rotation speed.

Second Comparison Example

The above-described steps S06 to S09 were omitted. The other steps were performed as in the first practical example, and a resist pattern was formed on the surface Wa of the wafer W. Specifically, in the second comparison example, after a liquid film was formed, the rotation speed of the wafer W was not decreased to the second rotation speed, and also the rotation speed of the wafer W was not increased to the third rotation speed.

Evaluation of Variation in Line Width between Shots

Regarding the resist patterns formed in the first practical example and the first and second comparison examples, nine measurement points were set for each shot, and a line width was measured at each measurement point. A standard deviation was calculated by setting, as the population, a line width data group obtained by calculating an average line width for each shot, and then the value three times larger than the standard deviation was set as a first variation evaluation value.

Evaluation of Variation in Line Width in Shot

Regarding the resist patterns formed in the first practical example and the first and second comparison examples, nine measurement points were set for each shot, and a line width was measured at each measurement point. A standard deviation was calculated by setting, as the population, every line width data obtained in this measurement, and the value three times larger than the standard deviation was set as a second variation evaluation value.

Comparison Result of Variation Evaluation Value

The first variation evaluation value of the wafer W in the first comparison example was approximately 40% smaller than that of the wafer W in the second comparison example. In light of this result, it was confirmed that, by increasing the rotation speed of a wafer W to the third rotation speed after the liquid film is formed so as to adjust the state of the liquid film, a variation in the development progress amount can be suppressed.

The first variation evaluation value of the wafer W in the first practical example was approximately 9% smaller than that of the wafer W in the first comparison example. In light of this result, it was confirmed that, after the liquid film is formed, by decreasing the rotation speed of a wafer W to the second rotation speed once before being increased to the third rotation speed, a variation in the development progress amount can be further suppressed.

The second variation evaluation value of the wafer W in the first practical example was approximately 5% smaller than that of the wafer W in the first comparison example. In light of this result, it was confirmed that, after the liquid film is formed, by decreasing the rotation speed of a wafer W to the second rotation speed once before being increased to the third rotation speed, a variation in the development progress amount in a shot can also be further suppressed.

What is claimed is:

1. A substrate processing method comprising the steps of:
   rotating a substrate held on a rotation holding unit at a first rotation speed in a counterclockwise direction in a plan view;
   supplying a developer onto a surface of the rotating substrate only from a discharge port of a single developer nozzle in a state in which a liquid contact surface formed around the discharge port faces the surface of the rotating substrate, consisting of (i) positioning the developer nozzle over an outer peripheral side of the rotating substrate, and then (ii) supplying the developer from the discharge port to the surface of the rotating substrate;
   moving the developer nozzle from the outer peripheral side of the substrate to a rotation center of the rotating substrate while contacting the liquid contact surface formed around the discharge port with the developer on the surface of the rotating substrate so as to spirally apply the developer in such a manner that a liquid film of the developer is formed on the surface of rotating substrate;
   rotating the substrate at a second rotation speed, which is slower than the first rotation speed after the liquid film is formed on the surface of the substrate, in a state in which the supply of the developer from the discharge port is stopped;
   rotating the substrate at a third rotation speed, which is faster than the first rotation speed, after the substrate is rotated at the second rotation speed; and
   reducing rotation speed of the substrate to the second rotation speed or less, after the substrate is rotated at the third rotation speed, in such a manner that the liquid film is held on the surface of the substrate.

2. The substrate processing method according to claim 1, further comprising the step of, after the liquid film is formed on the surface of the substrate, distancing the liquid contact surface from the surface of the substrate before rotation of the substrate at the second rotation speed is completed.

3. The substrate processing method according to claim 2, wherein the step of distancing the liquid contact surface, which is a surface of the nozzle formed around the discharge port, from the surface of the substrate includes the steps of:
   distancing the liquid contact surface from the surface of the substrate by a first distance at a first speed; and
   further distancing the liquid contact surface at a second speed which is slower than the first speed, after holding a state in which the liquid contact surface is separated from the surface of the substrate by the first distance.

4. The substrate processing method according to claim 3, wherein the first distance is a distance such that a liquid column is formed between the liquid film of the developer and the liquid contact surface.

5. The substrate processing method according to claim 1, wherein, when the liquid film is formed on the surface of the substrate by moving the nozzle while the liquid contact surface is in contact with the developer, a moving speed of the nozzle is changed in a middle of the step of moving the nozzle during formation of the liquid film on the surface of the substrate.

6. The substrate processing method according to claim 5, wherein, when the liquid film is formed on the surface of the substrate by moving the nozzle while the liquid contact surface is in contact with the developer, the moving speed of the nozzle is reduced as the discharge port approaches the rotation center of the substrate.

7. The substrate processing method according to claim 1, wherein, when the liquid film is formed on the surface of the substrate by moving the nozzle while the liquid contact surface is in contact with the developer, a discharge amount of the developer from the discharge port is changed in a middle of the step of moving the nozzle during formation of the liquid film on the surface of the substrate.

8. The substrate processing method according to claim 7, wherein, when the liquid film is formed on the surface of the substrate by moving the nozzle while the liquid contact surface is in contact with the developer, the discharge amount of the developer from the discharge port is increased as the discharge port approaches the rotation center of the substrate.

9. The substrate processing method according to claim 1, wherein, when the liquid film is formed on the surface of the substrate by moving the nozzle while the liquid contact surface is in contact with the developer, the nozzle is moved under condition that a position where the discharge port deviates from the rotation center of the substrate is treated as an end point of the step of moving the nozzle during formation of the liquid film on the surface of the substrate.

10. The substrate processing method according to claim 9, wherein, when the liquid film is formed on the surface of the substrate by moving the nozzle while the liquid contact surface is in contact with the developer, the nozzle is moved under condition that a position where the discharge port deviates from the rotation center of the substrate and the rotation center of the substrate passes on the liquid contact surface is treated as the end point of the step of moving the nozzle during formation of the liquid film on the surface of the substrate.

11. The substrate processing method according to claim 9, wherein, when the liquid film is formed on the surface of the substrate by moving the nozzle while the liquid contact surface is in contact with the developer, the nozzle is moved until the discharge port passes through the rotation center of the substrate.

12. A substrate processing apparatus comprising:
a rotation holding unit configured to hold and rotate a substrate;
a developer supply unit which has a single developer nozzle including a discharge port for a developer and a liquid contact surface formed around the discharge port, and a nozzle conveying mechanism for conveying the developer nozzle, which supplies the developer onto a surface of the substrate; and
a controller,
wherein the controller is configured to perform:
controlling the rotation holding unit in such a manner that the substrate is rotated at a first rotation speed in a counterclockwise direction in a plan view,
controlling the developer supply unit in such a manner that the developer is supplied onto the surface of the substrate only from the discharge port of the developer nozzle in a state in which the liquid contact surface faces the surface of the substrate, consisting of (i) positioning the developer nozzle over an outer peripheral side of the rotating substrate, and then (ii) in the developer from the discharge port to the surface of the rotating substrate,
controlling the developer supply unit, after the supply of the developer from the discharge port is started, to move the developer nozzle from the outer peripheral side of the substrate to a rotation center of the rotating substrate while contacting the liquid contact surface formed around the discharge port with the developer on the surface of the rotating substrate so as to spirally apply the developer in such a manner that a liquid film of the developer is formed on the surface of the rotating substrate,
controlling, after the liquid film is formed on the surface of the substrate, the rotation holding unit in such a manner that the substrate is rotated at a second rotation speed, which is slower than the first rotation speed in a state in which the supply of the developer from the discharge port is stopped,
controlling, after the substrate is rotated at the second rotation speed, the rotation holding unit in such a manner that the substrate is rotated at a third rotation speed, which is faster than the first rotation speed, and
controlling, after the substrate is rotated at the third rotation speed, the rotation holding unit in such a manner that the substrate is rotated at the second rotation speed or less so as to hold the liquid film on the surface of the substrate.

13. A non-transitory computer-readable medium storing a program causing a substrate processing apparatus to execute a substrate processing method according to claim 1.

* * * * *